United States Patent
Berkcan et al.

(10) Patent No.: US 7,253,615 B2
(45) Date of Patent: Aug. 7, 2007

(54) MICROELECTROMECHANICAL SYSTEM SENSOR AND METHOD FOR USING

(75) Inventors: Ertugrul Berkcan, Clifton Park, NY (US); Wei-Cheng Tian, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 113 days.

(21) Appl. No.: 10/839,095

(22) Filed: May 5, 2004

(65) Prior Publication Data
US 2005/0248340 A1 Nov. 10, 2005

(51) Int. Cl.
*G01R 33/02* (2006.01)
(52) U.S. Cl. .................................................. 324/244
(58) Field of Classification Search ................ 324/244, 324/252, 259, 260, 207.14, 658, 660, 661, 324/686, 690; 73/514.32, 514.33, 514.34
See application file for complete search history.

(56) References Cited

U.S. PATENT DOCUMENTS

| | | | |
|---|---|---|---|
| 4,680,544 A * | 7/1987 | Rudolf | 324/259 |
| 6,215,318 B1 * | 4/2001 | Schoefthaler et al. | 324/658 |
| 6,275,034 B1 * | 8/2001 | Tran et al. | 324/252 |
| 6,426,621 B1 * | 7/2002 | Chen | 324/244 |
| 6,462,566 B1 * | 10/2002 | Schoefthaler et al. | 324/750 |
| 6,593,677 B2 * | 7/2003 | Behin et al. | 310/309 |
| 6,664,786 B2 * | 12/2003 | Kretschmann et al. | 324/259 |
| 6,848,317 B2 * | 2/2005 | Kim | 73/714 |
| 2002/0020219 A1 | 2/2002 | DeRoo et al. | |
| 2003/0020472 A1 | 1/2003 | Kretschmann et al. | |
| 2003/0200785 A1 | 10/2003 | Platt | |
| 2004/0027029 A1 * | 2/2004 | Borwick et al. | 310/309 |
| 2004/0158439 A1 * | 8/2004 | Kim et al. | 702/190 |
| 2005/0068989 A1 * | 3/2005 | Herbert et al. | 370/506 |

* cited by examiner

*Primary Examiner*—Edward Lefkowitz
*Assistant Examiner*—Kenneth J. Whittington
(74) *Attorney, Agent, or Firm*—Fletcher Yoder

(57) ABSTRACT

According to some embodiments, an apparatus includes a movable portion through which a sensing current is to be conducted. The movable portion might comprise, for example, a beam or plate suspended above a well in a Microelectromechanical System (MEMS) substrate. The apparatus may also include a sensing portion coupled to the movable portion, and the movable portion and/or sensing portion may move in a direction normal to the substrate in response to a magnetic field.

20 Claims, 14 Drawing Sheets

```
┌─────────────────────────────────────┐
│     OSCILLATE MOVABLE PORTION       │
│     BETWEEN A FIRST POSITION        │
│   AND A SECOND POSITION AT A        │
│     RESONATE FREQUENCY              │
│                            1202     │
└─────────────────────────────────────┘
                  │
                  ▼
┌─────────────────────────────────────┐
│      MEASURE ELECTRICAL             │
│  CHARACTERISTIC ASSOCIATED          │
│   WITH THE MOVABLE PORTION          │
│   WHEN A MAGNETIC FIELD IS          │
│            APPLIED                  │
│                            1204     │
└─────────────────────────────────────┘
```

FIG. 12

United States Patent US 7,253,615 B2

MICROELECTROMECHANICAL SYSTEM SENSOR AND METHOD FOR USING

BACKGROUND

A sensor may be used to determine an electromagnetic value. For example, a sensor might be used to determine the strength of a magnetic field or an amount of electrical current. Moreover, in some cases it may be important for the sensor to be small, inexpensive to produce, relatively precise, and/or sensitive. For example, in some applications a magnetic field sensor may need to detect small changes in the strength of a magnetic field.

SUMMARY

According to some embodiments, an apparatus includes a movable portion through which a sensing current is to be conducted. The apparatus also includes a sensing portion coupled to the movable portion, wherein the movable portion is to move in a direction normal to a substrate in response to a magnetic field.

BRIEF DESCRIPTION OF THE DRAWINGS

FIG. 12 illustrates a method according to some embodiments.

DETAILED DESCRIPTION

Figure 1A:
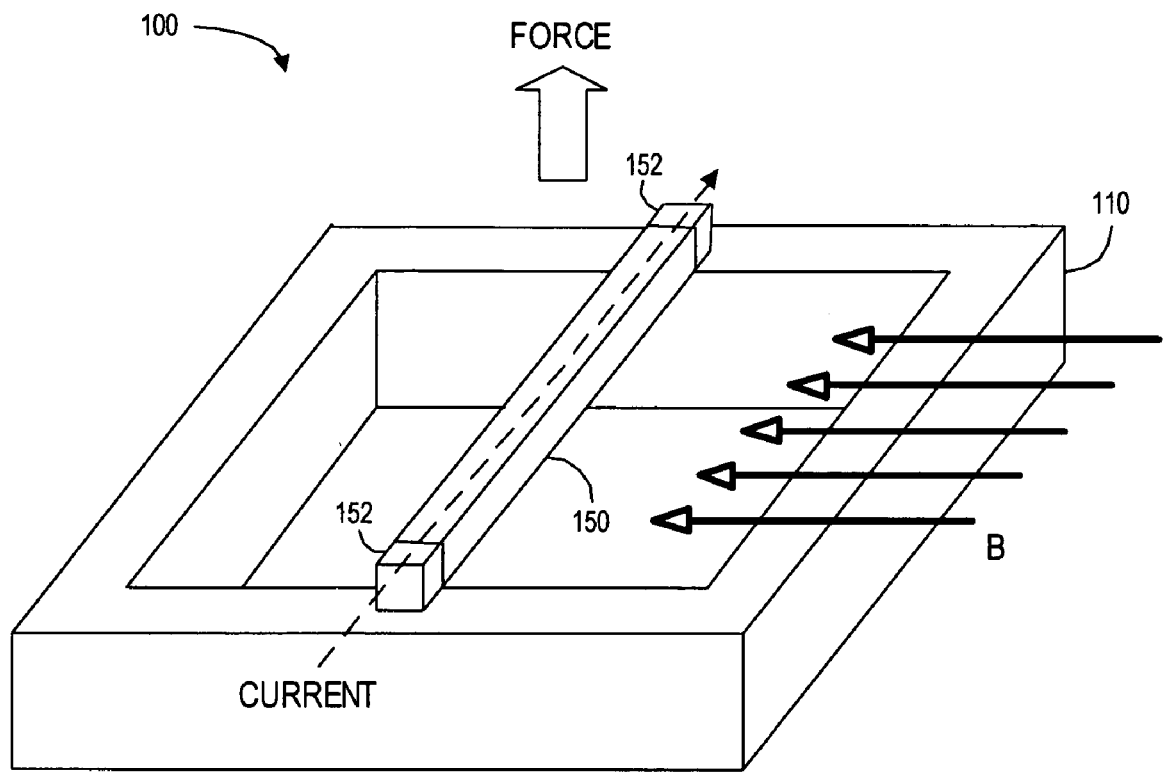
FIG. 1A is a perspective view of an apparatus constructed in accordance with an exemplary embodiment of the invention.

FIG. 1A is a perspective view of an apparatus 100 constructed in accordance with an exemplary embodiment of the invention. The apparatus 100 may be, for example, a Microelectromechanical System (MEMS) magnetic field or current sensor. The apparatus 100 includes a movable portion suspended in a well 110 formed in or on a substrate. The well 110 might be formed, for example, by etching into a layer of dielectric material such as oxide, nitride, or a polymer (or a combination of materials). According to this embodiment, the movable portion is a suspended beam 150 attached via anchors 152 to the well 110 on either end such that it is positioned substantially parallel to the well 110 and/or the substrate.

Figure 2:
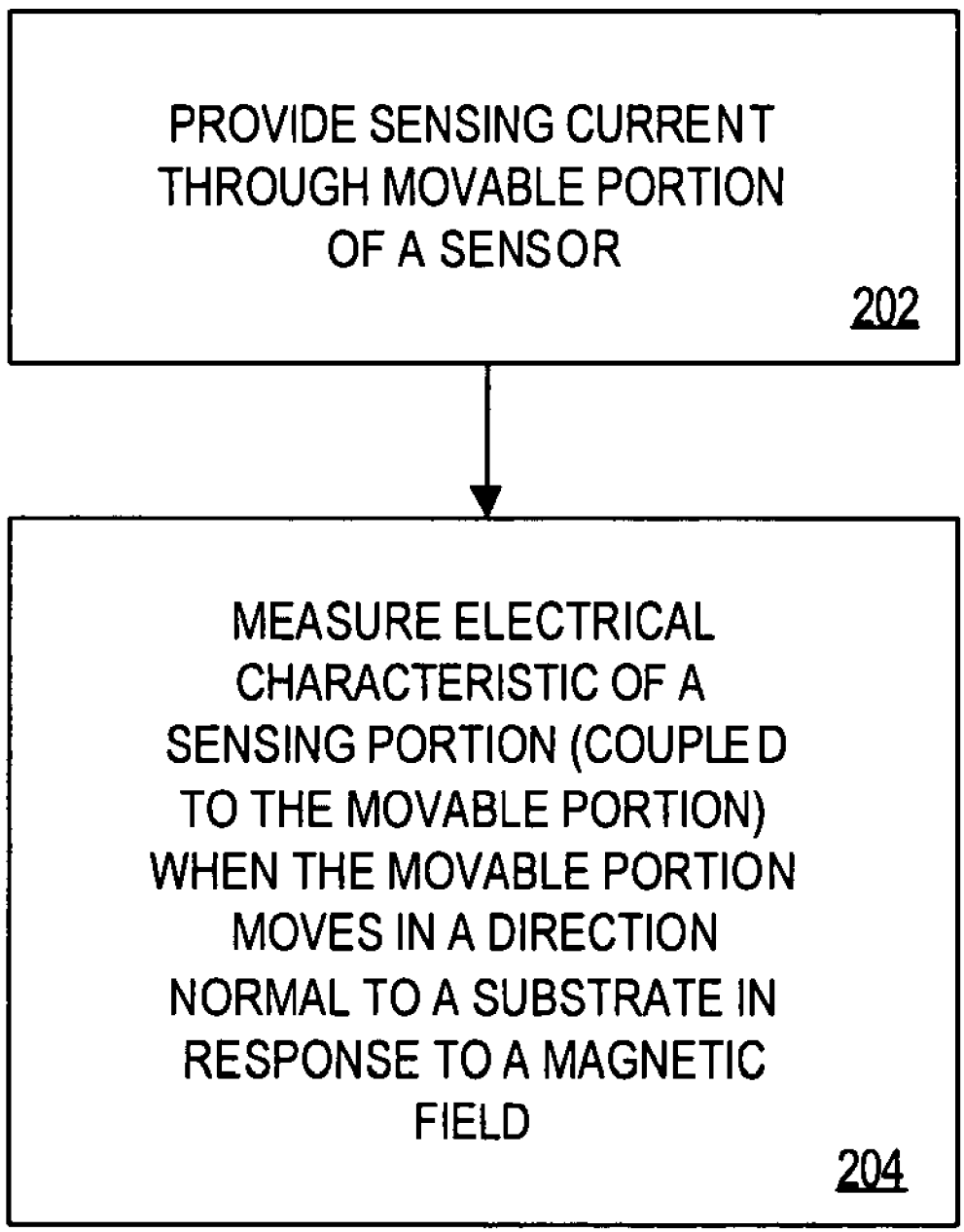
FIG. 2 illustrates a method according to some embodiments.

FIG. 2 illustrates a method according to some embodiments. At Step 202, a sensing current is provided through a movable portion of a sensor. For example, the sensing current may be conducted through the suspended beam 150 of FIG. 1A in a first direction (as indicated by the dashed arrow in FIG. 1A).

Referring again to FIG. 2, at Step 204 an electrical characteristic of a sensing portion is measured when the movable portion moves in a direction normal to the substrate in response to a magnetic field.

Figure 1B:
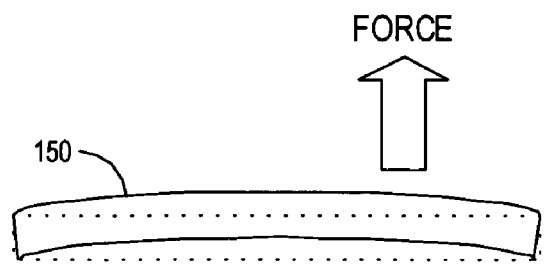
FIG. 1B is a side view of the suspended beam of FIG. 1.

For example, as illustrated in FIG. 1A a Lorentz force will be generated when a magnetic field or flux density B is present. That is, a force will act on the electrons that are moving through the suspended beam 150—and the strength of the force will depend at least in part on magnetic field's flux density. Note that the direction of the Lorentz force will be perpendicular to those of the sensing current and the magnetic field B (e.g., in FIG. 1A the force will push upwards on the suspended beam 150). This force will cause at least a portion of the suspended beam 150 to move in a direction normal to the substrate in response to the magnetic field B. FIG. 1B is a side view of the suspended beam 150 illustrating that the suspended beam 150 may flex upwards in response to the Lorentz force.

A sensing portion may then be used to measure an electrical characteristic that changes due to the movement of the movable portion. According to one embodiment, the electrical characteristic that is measured is a change in piezoresistance.

Figure 3:
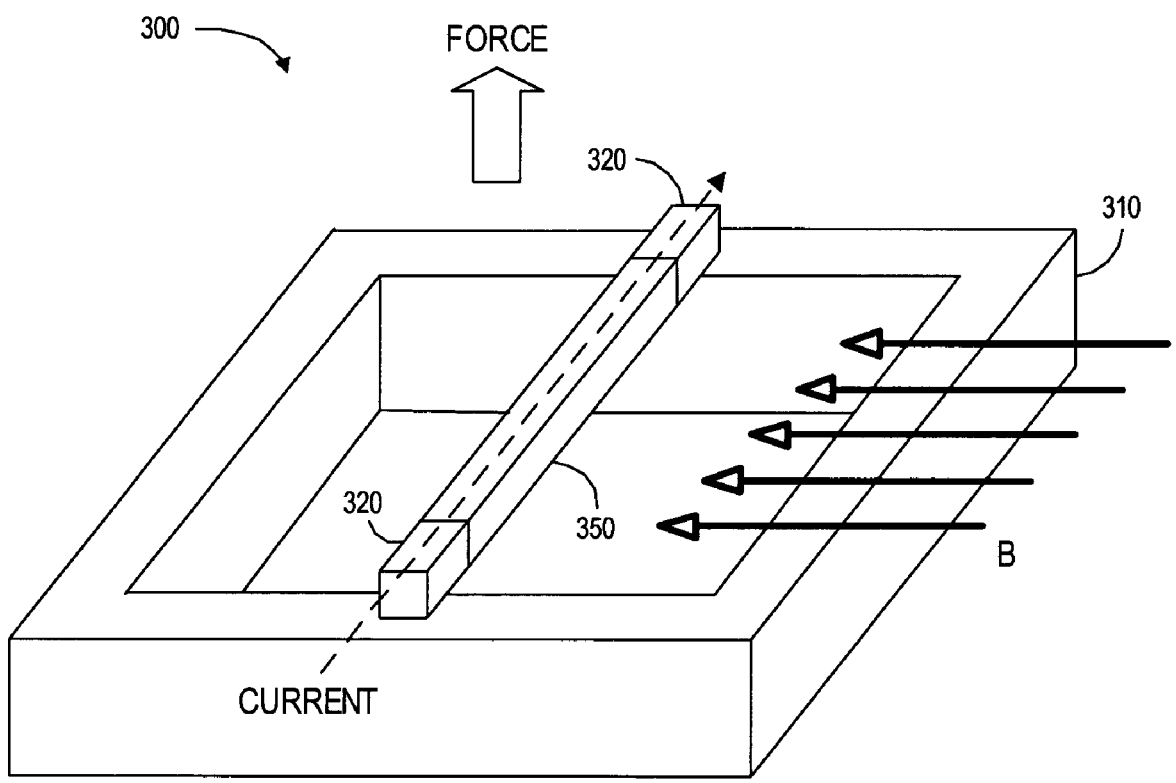
FIG. 3 is a perspective view of an apparatus constructed in accordance with an exemplary embodiment of the invention.

FIG. 3 is a perspective view of an apparatus 300 constructed in accordance with this embodiment of the invention. As before, a suspended beam 350 is anchored to a well 310. In this case, the suspended beam 350 is anchored to the well 310 using piezoresistors 320 (the "sensing portion"). That is, stress will cause the resistance associated with the piezoresistors 320 to change. Note that the beam 350 itself may have piezoresistance characteristics or a piezoresistor may be embedded into or onto the beam. Also note that both surface and bulk micromachining may be used to create the apparatus 300.

When a magnetic field B is present, the beam 350 will flex upwards and create stress that is experienced by the piezoresistors 320. Moreover, an increase in the strength of the magnetic field B will increase the amount of the stress (and therefore the change in resistance associated with the piezoresistors 320 will increase). As a result, the resistance associated with the piezoresistors 320 can be measured and used to detect and/or determine the strength of the magnetic field B. Thus, when a known sensing current is provided and the piezoresistance characteristics of the piezoresistors 320 are measured, the apparatus 300 may act as a magnetic field sensor.

According to another embodiment, an unknown amount of current (not illustrated in FIG. 3) creates the magnetic field B. In this case, the apparatus 300 may measure magnetic field B to indirectly act as a current sensor (e.g., the apparatus 300 may be placed close to the unknown current that is creating the magnetic field B). Note that the current being sensed might be an Alternating Current (AC) or a Direct Current (DC). Moreover, the current may be sensed in a non-contact manner.

Figure 4A:
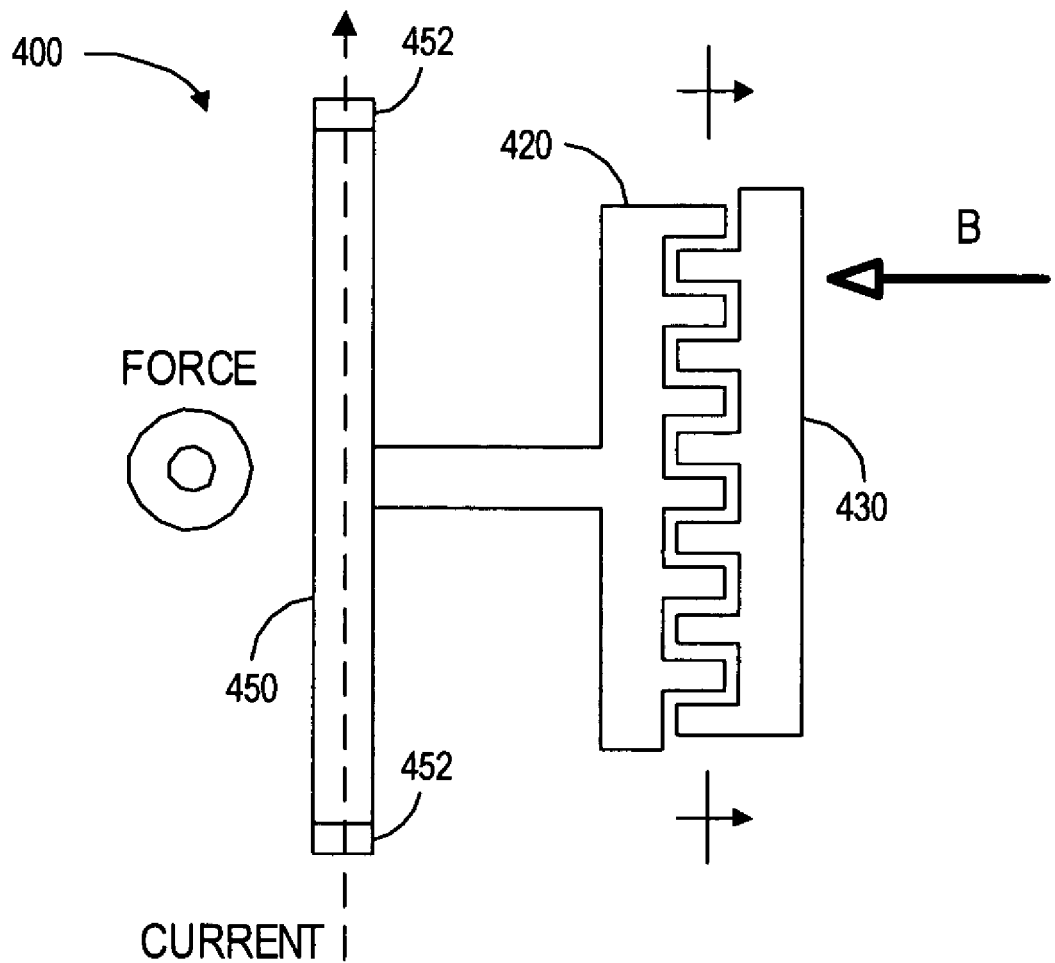
FIG. 4A is a top view of an apparatus constructed in accordance with another exemplary embodiment of the invention.

Although piezoresistance is used to measure the magnetic field B in FIG. 3, other electrical characteristics may be measured instead. For example, FIG. 4A is a top view of an apparatus 400 constructed in accordance with another exemplary embodiment of the invention. As before, a sensing current flows through a beam 450 suspended via anchors 452, and a magnetic field B generates a Lorentz force (pushing the beam 450 upwards out of the page as illustrated in FIG. 4A).

Figure 4B:
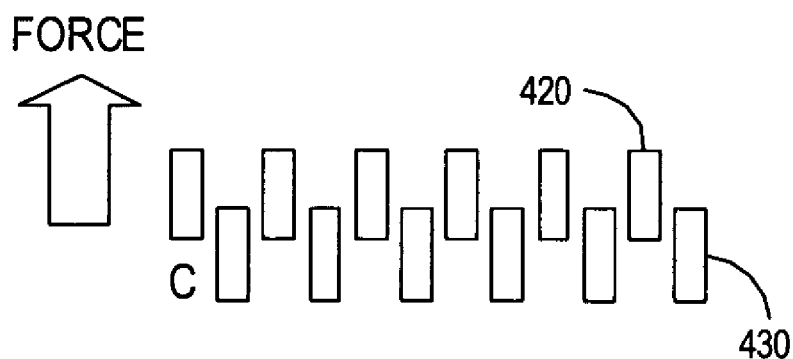
FIG. 4B is a cross-sectional view of the movable and fixed fingers of FIG. 4A.

In this case, a sensing comb 420 with a number of fingers is coupled to the suspended beam 450. The fingers of the sensing comb 420 are interleaved with fingers of a fixed comb 430. Thus, an increase in the magnetic field B will push the movable beam 450 upwards and, the displacement between the fingers of the two combs 420, 430 will increase. FIG. 4B is a cross-sectional view of the fingers illustrating such a displacement. Note that the fingers of the sensing comb 420 could be offset with respect to the fingers of the fixed comb 430 or both sets of fingers could be aligned with respect to a common central axis.

Note that an amount of capacitance C between the fingers of the movable sensing comb 420 and the fingers of the fixed comb 430 may change as result of this displacement. Thus, the strength of the magnetic field B can be determined by measuring the capacitance C. Moreover, the change in capacitance C associated with each finger can be added, the performance of the apparatus 400 (e.g., increasing the number of fingers may increase the sensitivity of the apparatus 400).

Figure 5:
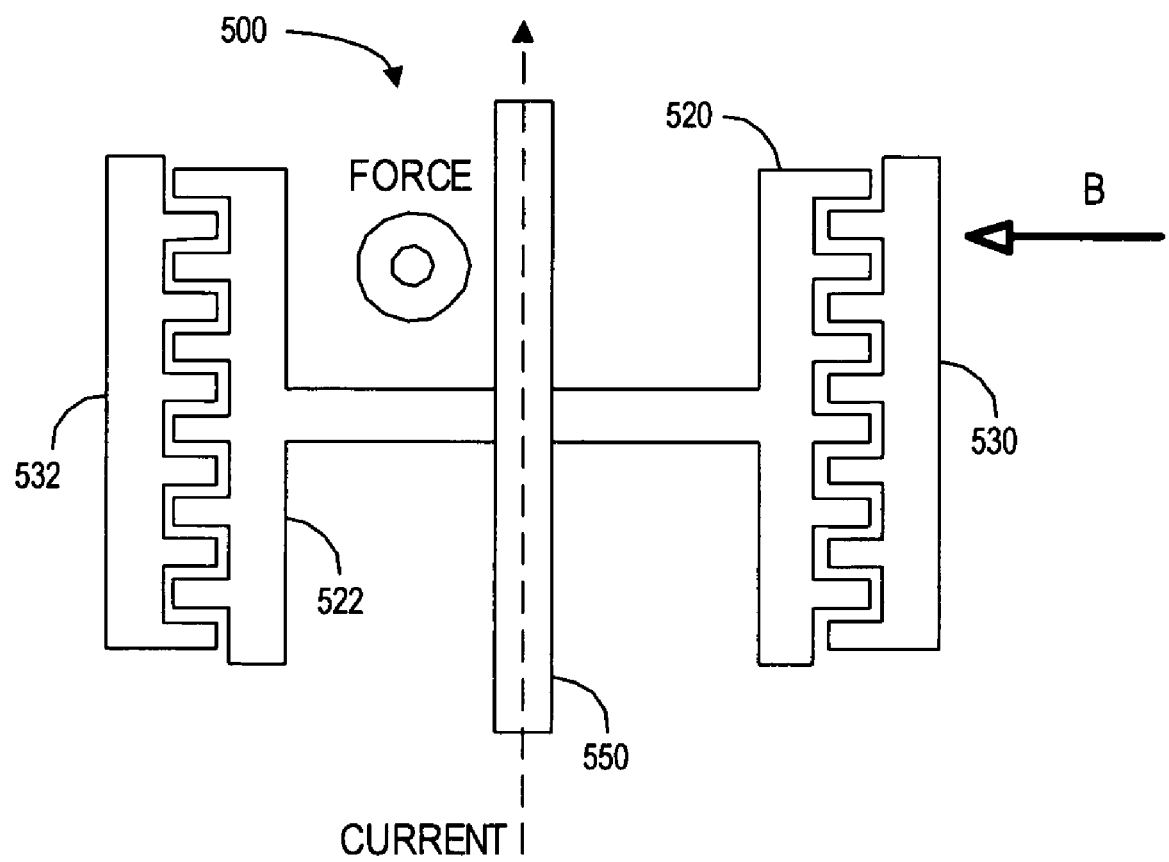
FIG. 5 is a top view of an apparatus constructed in accordance with another exemplary embodiment of the invention.

FIG. 5 is a top view of an apparatus 500 constructed in accordance with another exemplary embodiment of the invention. As before, a sensing current flows through a suspended beam 550 and, a magnetic field B generates a Lorentz force (pushing the beam 550 upwards out of the page as illustrated in FIG. 5). A first sensing comb 520 with a number of fingers is coupled to the suspended beam 550, and the fingers of the first sensing comb 520 are interleaved with fingers of a first fixed comb 530. According to this embodiment, a second sensing comb 522 with a number of fingers is also coupled to the suspended beam 550, and the fingers of the second sensing comb 522 are interleaved with fingers of a second fixed comb 532. In this case, the change in capacitance associated with the first and second sensing combs 520, 522 may be added to improve the sensitivity and/or the capacitance linearity of the apparatus 500.

According to still another embodiment, a quality factor value may be measured to detect and/or determine the strength of a magnetic field B. Note that there may be a number of different ways to determine the quality factor value (or to detect a change in the quality factor value). For example, a shift in resonant frequency due to the Lorentz force generated change in stress might be used. As another example, mutual inductive coupling (with leads shorted) might be used to obtain a back of Electro-Magnetic Field (EMF) force due to Lenz law (which results in a change of the quality factor value). As still another example, a voltage across open terminals might be read to read mutually inductive voltage.

Figure 6:
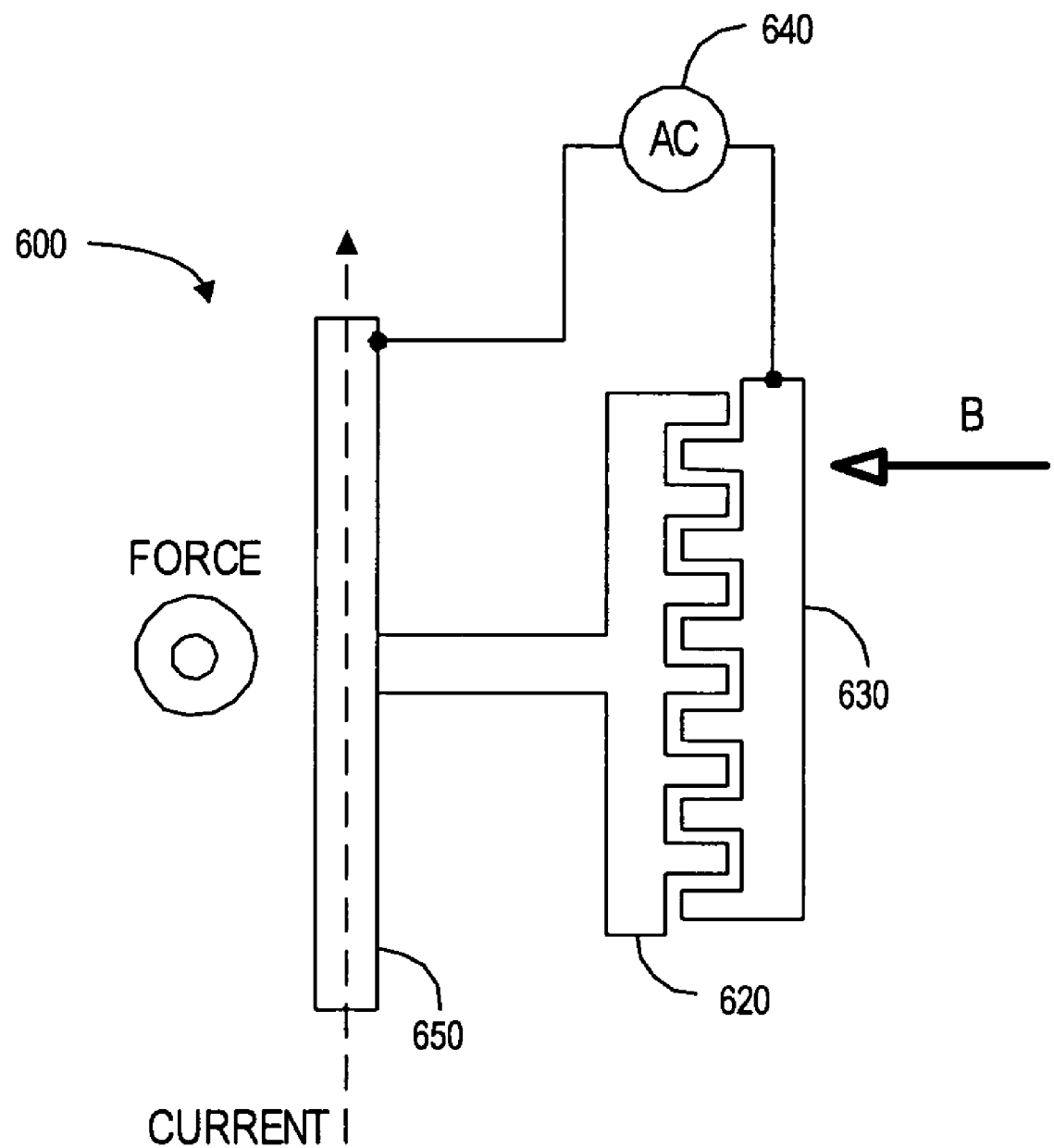
FIG. 6 is a top view of an apparatus constructed in accordance with another exemplary embodiment of the invention.

For example, FIG. 6 is a top view of an apparatus 600 constructed in accordance with another exemplary embodiment of the invention. As before, a sensing current flows through a suspended beam 650, and a magnetic field B generates a Lorentz force. A sensing comb 620 with a number of fingers is coupled to the suspended beam 650, and the fingers of the sensing comb 620 are interleaved with fingers of a fixed comb 630. In this case, an AC driver 640 is used to excite and a quality factor change between the sensing comb 620 and the fixed comb 630 is measured.

Figure 7:
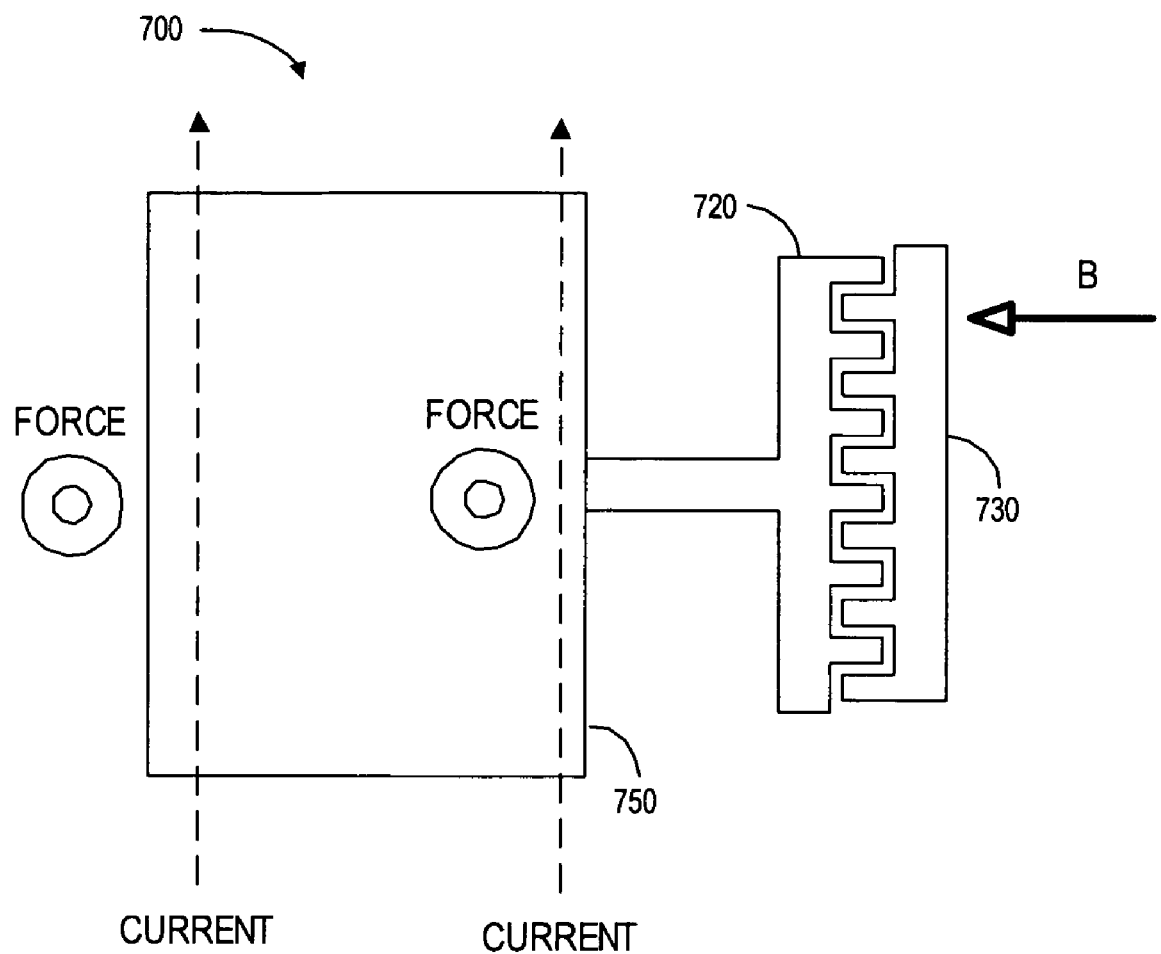
FIG. 7 is a top view of an apparatus constructed in accordance with still another exemplary embodiment of the invention.

Although a suspended beam has been used to illustrate a sensor's movable portion, the movable portion may have any shape. For example, FIG. 7 is a top view of an apparatus 700 constructed in accordance with still another exemplary embodiment of the invention. In this case, the movable portion is a suspended plate 750. Moreover, the suspended plate 750 has a first conducting path and a second conducting path. The sensing current flows through both paths in the same direction and, as a result, a magnetic field B will generate Lorentz forces for each path (pushing both the left and right sides of the plate 750 upwards out of the page as illustrated in FIG. 7). Any the electrical characteristics described herein might then be measured to sense the magnetic field B. For example, a sensing comb 720 with a number of fingers may be coupled to the plate 750, and the fingers of the sensing comb 720 may interleaved with fingers of a fixed comb 730 so that a change in capacitance can be measured. Because two Lorentz forces are generated and used to create the mechanical displacement, the sensitivity of the apparatus may be improved.

Figure 8:
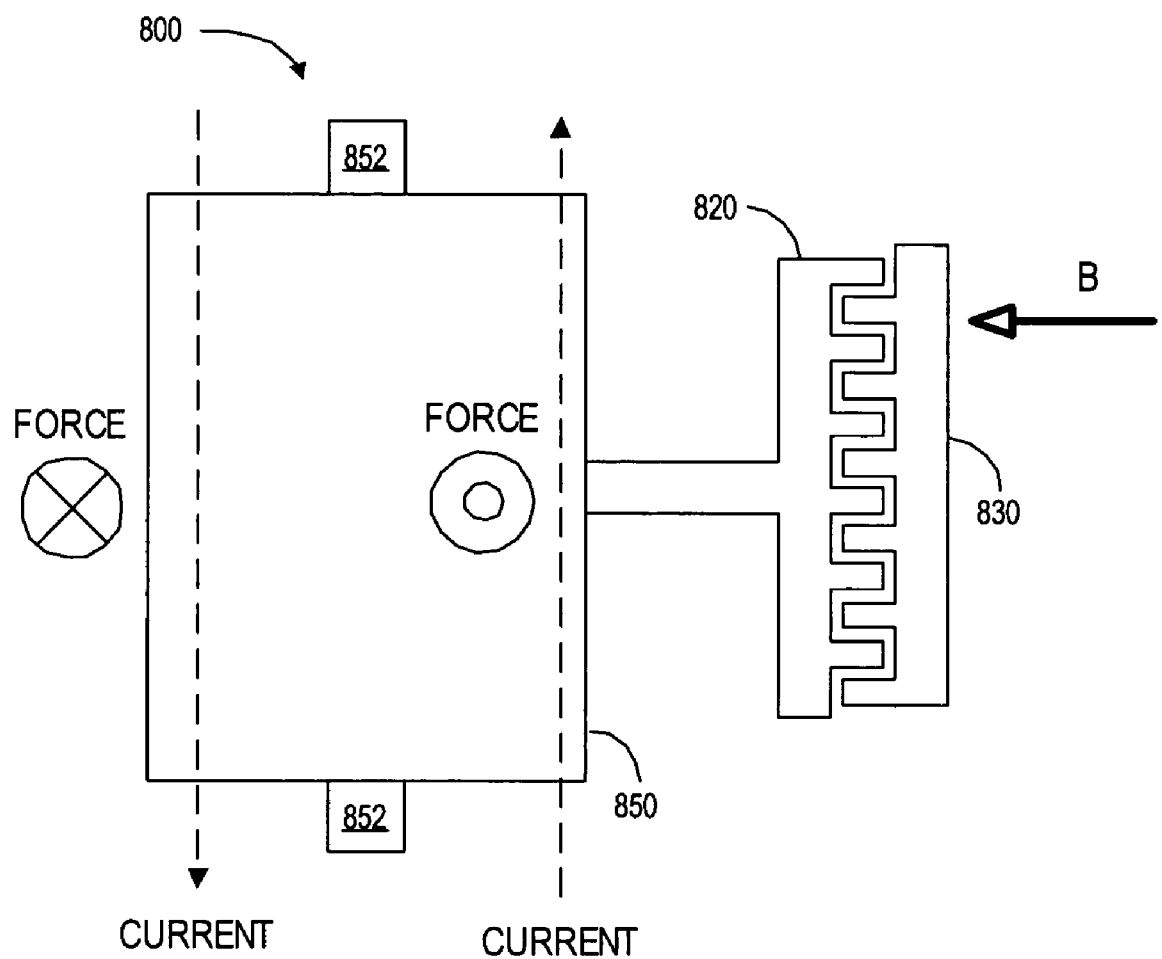
FIG. 8 is a top view of an apparatus constructed in accordance with another exemplary embodiment of the invention.

FIG. 8 is a top view of an apparatus 800 constructed in accordance with another exemplary embodiment of the invention. In this case, a suspended plate 850 is anchored to a well using two anchors 852 (e.g., rotatable or twistable connectors) and the suspended plate 850 has a first conducting path and a second conducting path. In this case, the sensing current flows through both paths in opposite directions.

As a result, a magnetic field B will generate Lorentz forces for each path in opposite directions. In particular, the left side of the plate 850 illustrated in FIG. 8 will be pushed downwards into the page while the right side will be pushed upwards out of the page. This will cause the plate 850 to twist, which may increase the amount of displacement between the fingers of a sensing comb 820 and a fixed comb 830 (improving the sensitivity of the apparatus 800). As another approach, the anchors 852 may be piezoresistors and the stress associated with the twisting plate 850 may be measured to determine the presence and/or strength of the magnetic field B. Although a plate 850 is illustrated in FIG. 8, other shapes might be used. For example, empty portions or spaces might be provided in the plate (e.g., the plate might actually be a rectangular ring), reducing the associated mass and the stress.

Figure 9:
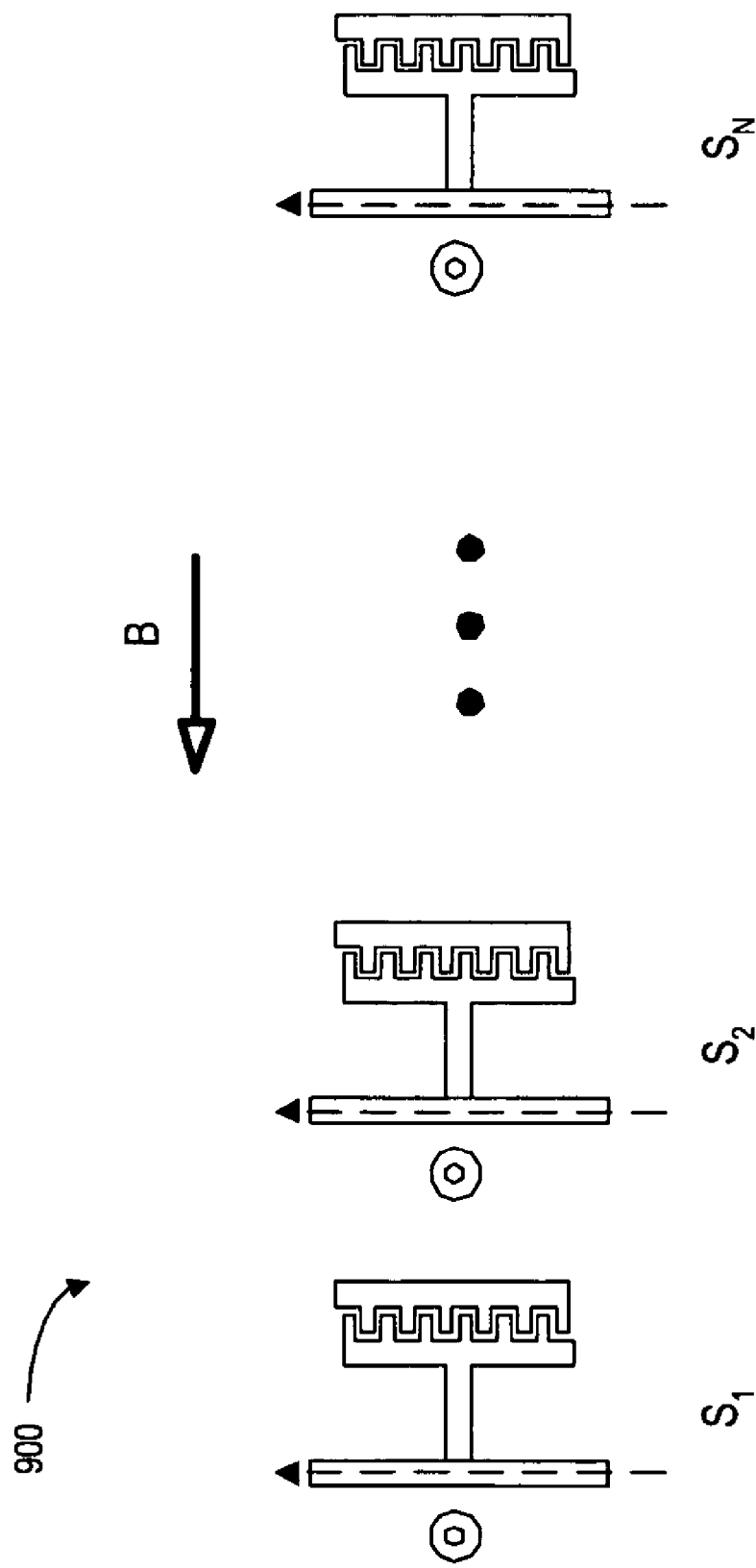
FIG. 9 illustrates an array of sensors constructed in accordance with another exemplary embodiment of the invention.

Note that more than one sensor may be used to measure a magnetic field and/or an electrical current. For example, FIG. 9 illustrates an array 900 of sensors $S_1$ through $S_N$. Each sensor may be designed in accordance with any of the embodiments described herein. Note that all of the sensors $S_1$ through $S_N$ might or might not be identical (e.g., different sensors could measure different electrical characteristics). Using multiple sensors may improve the performance of the apparatus. Assume, for example, the each of the sensors $S_1$ through $S_N$ measure a change in capacitance to detect a magnetic field B. Moreover, the change in capacitance associated with each sensor is C. In this case, the change in capacitance of the array 900 will be C*N (which may improve the detection limit of the device).

Figure 10:
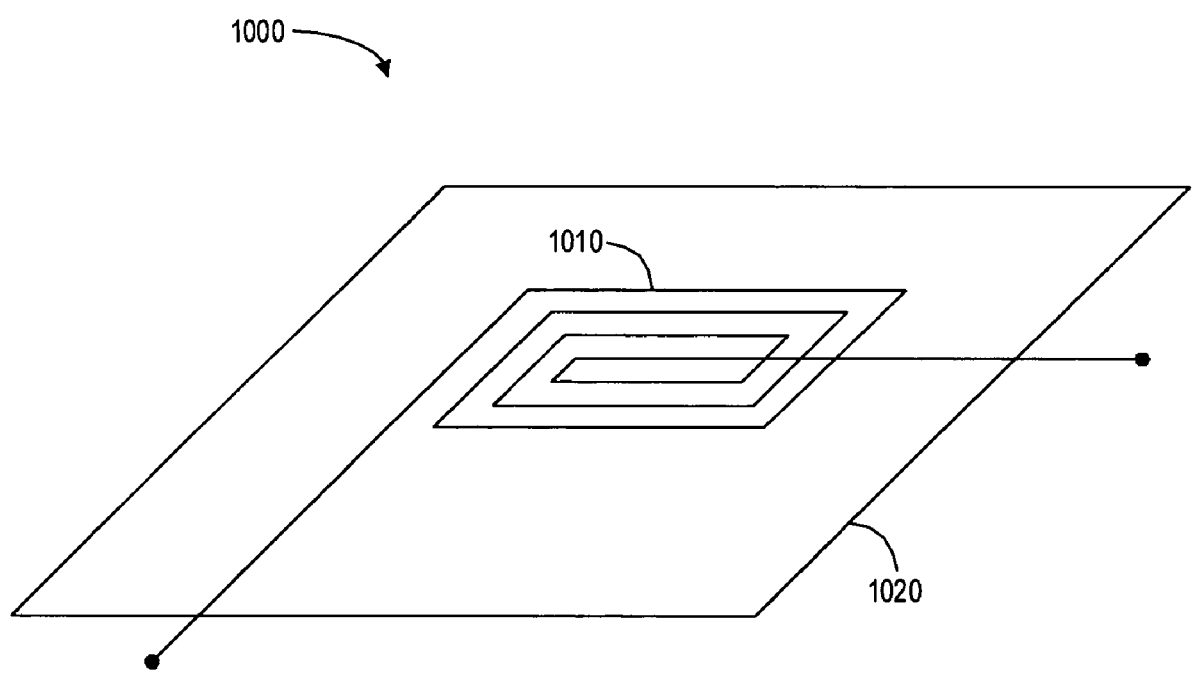
FIG. 10 is a perspective view of an apparatus constructed in accordance with yet another exemplary embodiment of the invention.

FIG. 10 is a perspective view of an apparatus 1000 constructed in accordance with yet another exemplary embodiment of the invention. In this case, a coil 1010 is provided on a movable portion. In this embodiment, the movable portion is a flexible membrane 1020. Note that the particular pattern shown for the coil 1010 is for illustration only, and that the actual dimensions and paths of the coil 1010 may be adjusted to increase deflection and/or to reduce inductive reactance. According to one embodiment, a sensing current is provided through the coil 1010. In this case, any movement of the flexible membrane 1020 may be measured to detect a Lorentz force and thereby the presence of a magnetic field B.

Figure 11:
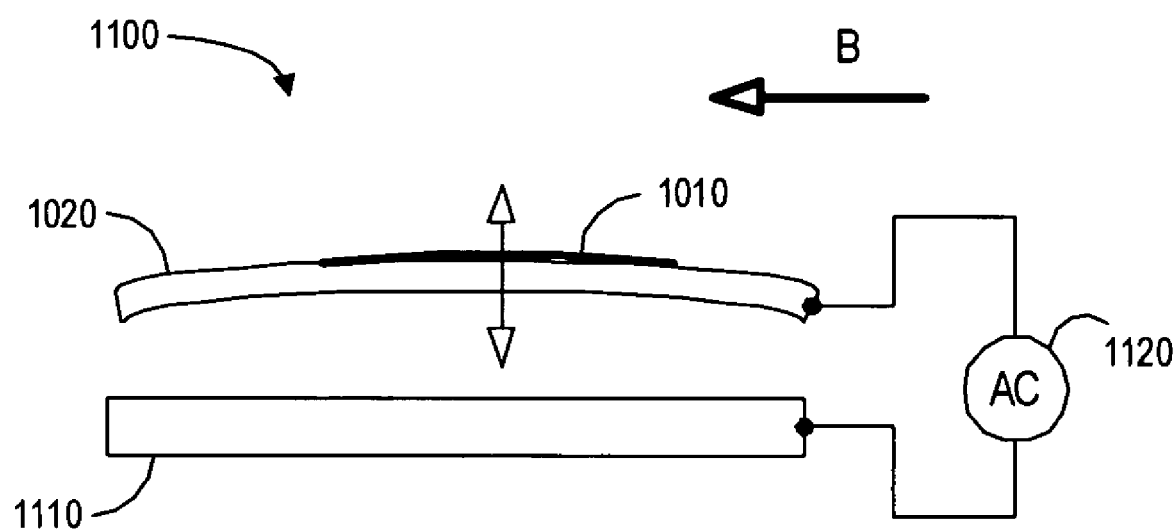
FIG. 11 is a side view of an apparatus constructed in accordance with an exemplary embodiment of the invention.

In another embodiment, the coil 1010 and the flexible membrane 1020 are used in the apparatus 1100 illustrated in FIG. 11. The flexible membrane 1020 is positioned near a plate 1110 and both are coupled to an AC driver 1120. In this way, the AC driver 1120 can provide a signal that causes the flexible membrane to oscillate between a first position (e.g., flexed upwards as illustrated in FIG. 11) and a second position (e.g., flexed downwards). Note that flexible membrane 1020 and the plate 1110 may be positioned for example, substantially parallel to each other and to a MEMS substrate. Moreover, the movement of the flexible membrane 1020 may be in a direction normal to the substrate. Although a membrane 1020 is illustrated in FIGS. 10 and 11, note that the movable portion could take another shape (e.g., a cantilever).

FIG. 12 illustrates a method according to some embodiments. At Step 1202, a movable portion is oscillated between a first position and a second position. For example, the AC driver 1120 may cause the flexible membrane 1020 to oscillate between two positions.

At Step 1204, an electrical characteristic associated with the movable portion is measured when a magnetic field is applied to determine the strength of the magnetic field. For example, an induced voltage associated with the coil 1010 may be measured using a mutually inductive coupling technique associated with the presence of a time varying flux. That is, because the apparatus 1100 causes the coil 1010 to move through the magnetic field B, a voltage difference will be created in the coil 1010 and the amount of the voltage difference will be proportional to the strength of the magnetic field B. Note that increasing the size of displacement experienced by the coil 1010 and/or the speed at which the coil moves 1010 will improve the sensitivity of the device 1100. As a result, the AC driver 1120 might cause the flexible membrane 1020 to oscillate at a relatively high, substantially resonate frequency (e.g., the membrane 1020 might oscillate at a 10 megahertz frequency).

Figure 13:
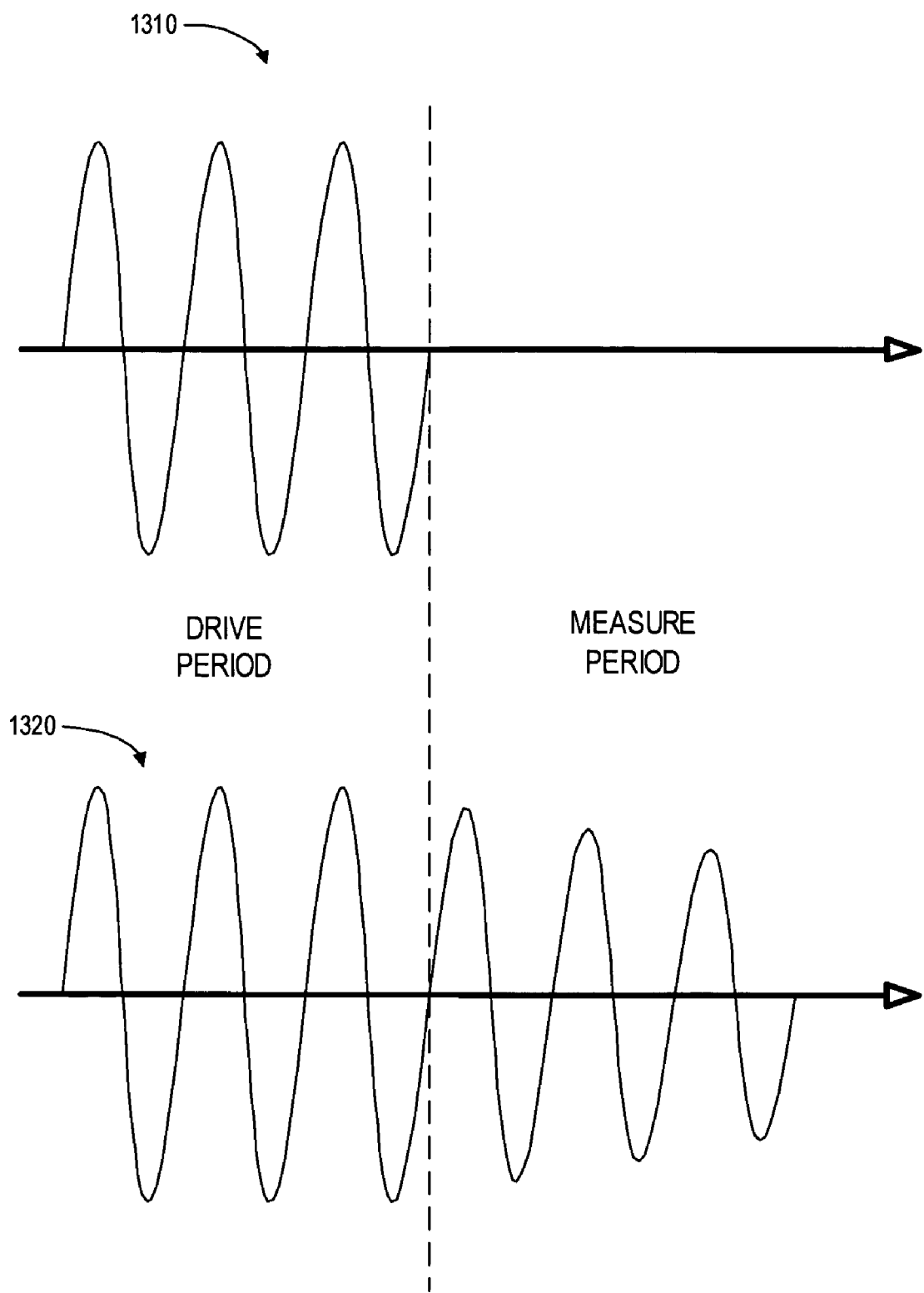
FIG. 13 illustrates a signal according to some embodiments.

Also note that applying a signal to make the flexible membrane 1020 oscillate might interfere with the measurement of the induced voltage. According to one embodiment, a signal 1310 such as the one illustrated with respect to FIG. 13 may be applied by the AC driver 1120. That is, the AC driver 1120 may provide an oscillating signal during a drive period but not during a measure period. As illustrated by the movement graph 1320, the flexible membrane 1020 will continue to oscillate during the measure period (although the amount of movement might begin to decrease). The apparatus 1100 may then measure the induced voltage on the coil 1010 during this period to determine the strength of a magnetic field B. The process may then be repeated (e.g., after the induced voltage is measured, the AC driver 1120 may again provide an oscillating signal).

The following illustrates various additional embodiments of the present invention. These do not constitute a definition of all possible embodiments, and those skilled in the art will understand that the present invention is applicable to many other embodiments. Further, although the following embodiments are briefly described for clarity, those skilled in the art will understand how to make any changes, if necessary, to the above-described apparatus and methods to accommodate these and other embodiments and applications.

Figure 14:
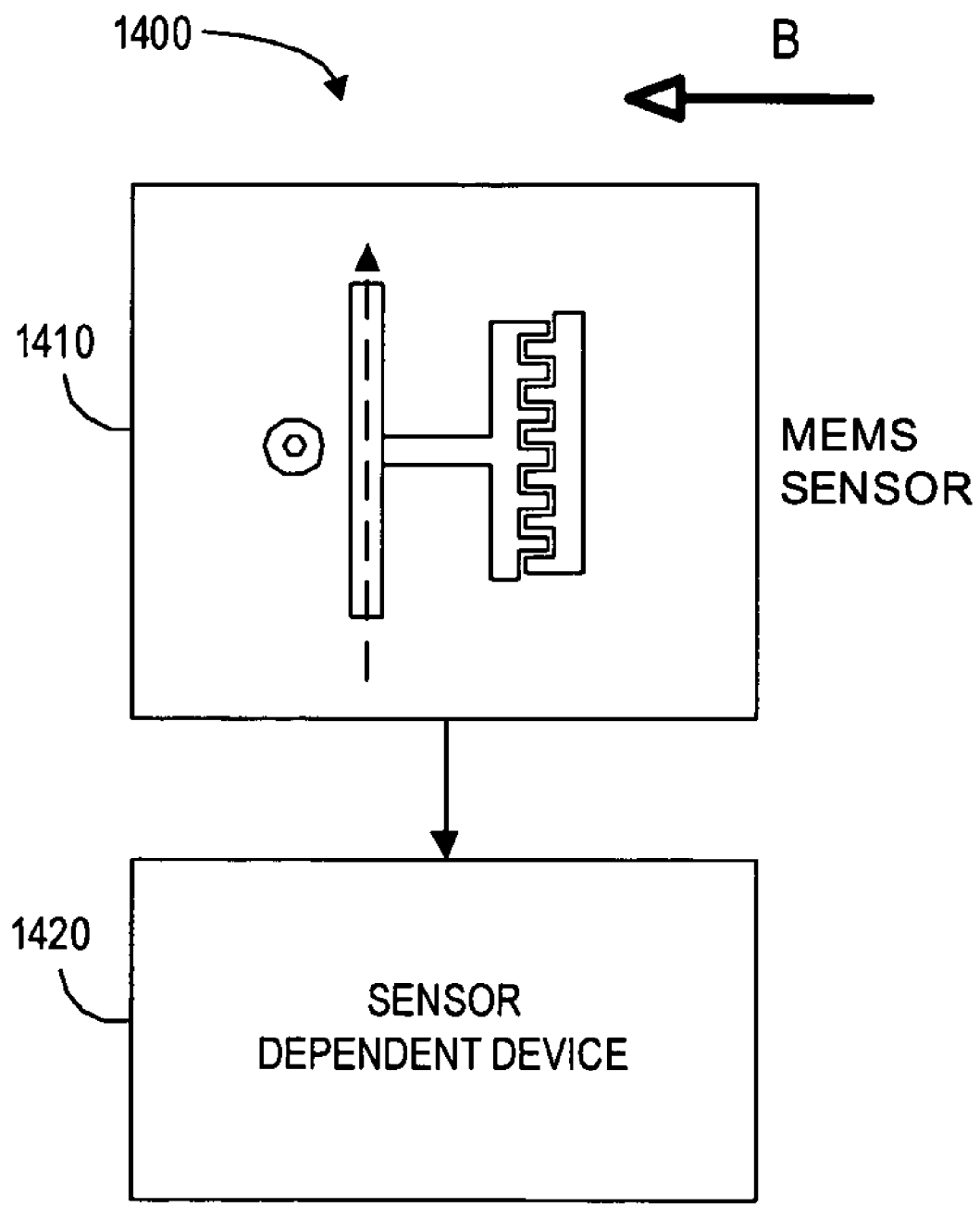
FIG. 14 is a system constructed in accordance with another exemplary embodiment of the invention.

While embodiments have been described with respect to sensors, note that any of the embodiments may be associated with a system 1400 such as the one illustrated in FIG. 14. The system 1400 includes a MEMS sensor 1410 that operates in accordance with any of the embodiments described herein. For example, the MEMS sensor 1410 might include (i) a movable portion through which a sensing current is to be conducted, and (ii) a sensing portion coupled to the movable portion, wherein the movable portion is to move in a direction normal to a substrate in response to a magnetic field.

Information from the MEMS sensor 1410 is provided to a sensor dependent device 1420 (e.g., via an electrical signal). When the MEMS sensor 1410 acts as a magnetic field sensor, the sensor dependent device 1420 might be, for example, associated with a security device (e.g., to detect when a magnet has moved away from the MEMS sensor 1410) or a medical device, such as a Magnetic Resonance Imaging (MRI) device. When the MEMS sensor 1410 acts as a current sensor, the sensor dependent device 1420 might be, for example, associated with an electrical controller, a power distribution device, a power meter, a circuit breaker, a consumer device, or a motor control device.

In addition, although some embodiments have been described with respect to a constant sensing current, according to another embodiment the magnetic field B is constant and mechanical displacement is used to measure an unknown amount of electrical current (e.g., a current through a suspended beam).

Moreover, although particular layouts have been described herein, embodiments may be associated with other layouts. For example, the well 310 illustrated in FIG. 3 might have a different shape. In some cases, there might not be a well 310 (e.g., the beam might sit on a MEMS substrate—so long as at least part of the beam is still free to move away from the substrate when a Lorentz force is applied).

Still other designs may take advantage of the fact that the movable portion may move in response to a magnetic field in two orthogonal directions. For example, finger on a movable comb might move both normal to and within a plane defined by a MEMS substrate. Similarly, some designs may take advantage of the fact that embodiments described herein may detect a magnetic field in two orthogonal dimensions.

In addition, although a single electrical characteristic is measured in the embodiments described herein, in some cases more than one characteristic might be measured. For example, both piezoresistance and capacitance values might be measured to improve the sensitivity of a sensor (e.g., by combining the approaches described with respect to FIGS. 3 and 4A).

As still another example, although a movable sensing comb and a fixed comb have been described with respect to some embodiments, a capacitance change between the fingers of two movable combs might be measured. For example, a first comb might move downwards in response to a magnetic field B while a second comb moves upwards.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed:

1. An apparatus, comprising:
   a substrate having a surface;
   a fixed comb mounted to the substrate and disposed generally parallel to the substrate surface;
   a movable portion through which a sensing current is to be conducted; and
   a comb-like sensing portion coupled to the movable portion and interleaved with the fixed comb, wherein the movable portion moves in a direction normal to the substrate surface in response to a magnetic field to produce a measurement resulting from movement of fingers of the sensing portion with respect to the fixed comb in the normal direction.

2. The apparatus of claim 1, wherein the substrate is associated with a microelectromechanical system wafer and the movable portion is positioned substantially parallel to the substrate surface.

3. The apparatus of claim 1, wherein the strength of the magnetic field is to be measured based on a piezoresistance change associated with the sensing portion.

4. The apparatus of claim 1, wherein the apparatus is a sensor in an array of sensors.

5. The apparatus of claim 1, wherein the apparatus is at least one of: (i) a magnetic field sensor, and (ii) an electrical current sensor.

6. The apparatus of claim 1, wherein the suspended plate has a first conducting path and a second conducting path.

7. The apparatus of claim 6, wherein the sensing current is to move through the two paths in a single direction.

8. The apparatus of claim 6, wherein the sensing current is to move through the two paths in opposite directions.

9. The apparatus of claim 1, wherein the strength of the magnetic field is to be measured based on a change in capacitance between the sensing comb and the fixed comb.

10. The apparatus of claim 1, wherein the strength of the magnetic field is to be measured based on a quality factor change between the sensing comb and the fixed comb.

11. The apparatus of claim 10, wherein the change in quality factor is determined in connection with at least one of: (i) a resonant frequency, (ii) mutual inductance coupling, and (iii) a mutually inductive voltage.

12. An apparatus, comprising:
    a fixed comb;
    a movable portion through which a sensing current is to be conducted; and
    a comb-like sensing portion coupled to the movable portion and interleaved with the fixed comb, wherein the movable portion moves in response to a magnetic field in two orthogonal directions including a direction normal to a substrate to produce a measurement resulting from movement of fingers of the sensing portion with respect to the fixed comb in the normal direction.

13. The apparatus of claim 12, wherein the substrate is associated with a microelectromechanical system wafer.

14. The apparatus of claim 12, wherein the strength of the magnetic field is to be measured based on at least one of: (i) a change in capacitance, (ii) a quality factor change, and (iii) a piezoresistance change.

15. The apparatus of claim 14, wherein the apparatus is at least one of: (i) a magnetic field sensor, and (ii) an electrical current sensor.

16. A method of sensing an electromagnetic value, comprising:
    providing a sensing current through a movable portion of a sensor, the movable portion comprising a comb-like portion interleaved with a fixed comb that is mounted to a substrate and generally parallel to a surface of the substrate; and
    measuring an electrical characteristic of the sensing portion coupled to the movable portion when the movable portion moves in a direction normal to the substrate surface in response to a magnetic field to produce a measurement resulting from movement of fingers of the sensing portion with respect to the fixed comb in the normal direction.

17. The method of claim 16, wherein electrical characteristic is associated with at least one of: (i) a change in capacitance, (ii) a quality factor change, and (iii) a piezoresistance change.

18. The method of claim 17, further comprising:
    determining, based on the measured electrical characteristic, at least one of: (i) a magnetic field value, and (ii) an electrical current value.

19. A system, comprising:
    a substrate having a surface;
    a fixed comb mounted to the substrate and disposed generally parallel to the substrate surface;
    a microelectromechanical system sensor, including:
    a movable portion through which a sensing current is to be conducted, and
    a comb-like sensing portion coupled to the movable portion and interleaved with the fixed comb, wherein the movable portion moves in a direction normal to the substrate surface in response to a magnetic field to produce a measurement resulting from movement of fingers of the sensing portion with respect to the fixed comb in the normal direction; and
    a sensor dependent device.

20. The system of claim 19, wherein the sensor dependent device is associated with at least one of: (i) a security device, (ii) a medical device, (iii) an electrical controller, (iv) a power distribution device, (v) a power meter, (vi) a circuit breaker, (vii) a consumer device, and (viii) a motor control device.

* * * * *